United States Patent
Trinh et al.

(10) Patent No.: US 11,309,491 B2
(45) Date of Patent: Apr. 19, 2022

(54) DATA STORAGE STRUCTURE FOR IMPROVING MEMORY CELL RELIABILITY

(71) Applicant: Taiwan Semiconductor Manufacturing Co., Ltd., Hsin-Chu (TW)

(72) Inventors: Hai-Dang Trinh, Hsinchu (TW); Chii-Ming Wu, Taipei (TW); Cheng-Yuan Tsai, Chu-Pei (TW); Tzu-Chung Tsai, Hsinchu County (TW); Fa-Shen Jiang, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 37 days.

(21) Appl. No.: 16/788,611

(22) Filed: Feb. 12, 2020

(65) Prior Publication Data
US 2021/0066587 A1 Mar. 4, 2021

Related U.S. Application Data

(60) Provisional application No. 62/891,556, filed on Aug. 26, 2019.

(51) Int. Cl.
*H01L 45/00* (2006.01)

(52) U.S. Cl.
CPC ........ *H01L 45/1233* (2013.01); *H01L 45/146* (2013.01); *H01L 45/147* (2013.01); *H01L 45/1608* (2013.01); *H01L 45/1675* (2013.01); *H01L 45/06* (2013.01)

(58) Field of Classification Search
CPC .................................................. H01L 45/1233
See application file for complete search history.

(56) References Cited

U.S. PATENT DOCUMENTS

| | | | |
|---|---|---|---|
| 8,767,439 | B2 | 7/2014 | Terai |
| 10,176,866 | B1 | 1/2019 | Trinh et al. |
| 10,516,106 | B2 | 12/2019 | Chu et al. |
| 2010/0243983 | A1 | 9/2010 | Chiang et al. |
| 2014/0050013 | A1 | 2/2014 | Wei et al. |
| 2021/0066587 | A1* | 3/2021 | Trinh .................. H01L 45/1675 |

FOREIGN PATENT DOCUMENTS

KR 20140081135 A 7/2014

OTHER PUBLICATIONS

Wong et al. "Metal Oxide RRAM" Proceedings of the IEEE, vol. 100, No. 6, Jun. 2012.

* cited by examiner

*Primary Examiner* — Mounir S Amer
(74) *Attorney, Agent, or Firm* — Eschweiler & Potashnik, LLC

(57) ABSTRACT

Various embodiments of the present disclosure are directed towards a memory cell including a data storage structure. A top electrode overlies a bottom electrode. The data storage structure is disposed between the top electrode and the bottom electrode. The data storage structure includes a first data storage layer, a second data storage layer, and a third data storage layer. The second data storage layer is disposed between the first and third data storage layers. The second data storage layer has a lower bandgap than the third data storage layer. The first data storage layer has a lower bandgap than the second data storage layer.

20 Claims, 9 Drawing Sheets

DATA STORAGE STRUCTURE FOR IMPROVING MEMORY CELL RELIABILITY

REFERENCE TO RELATED APPLICATION

This application claims the benefit of U.S. Provisional Application No. 62/891,556, filed on Aug. 26, 2019, the contents of which are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random access memory (RRAM) is one promising candidate for next generation non-volatile memory technology due to its simple structure and compatibility with complementary metal-oxide semiconductor (CMOS) logic processes. An RRAM cell includes a dielectric data storage structure having a variable resistance. Such a dielectric data storage structure is generally placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
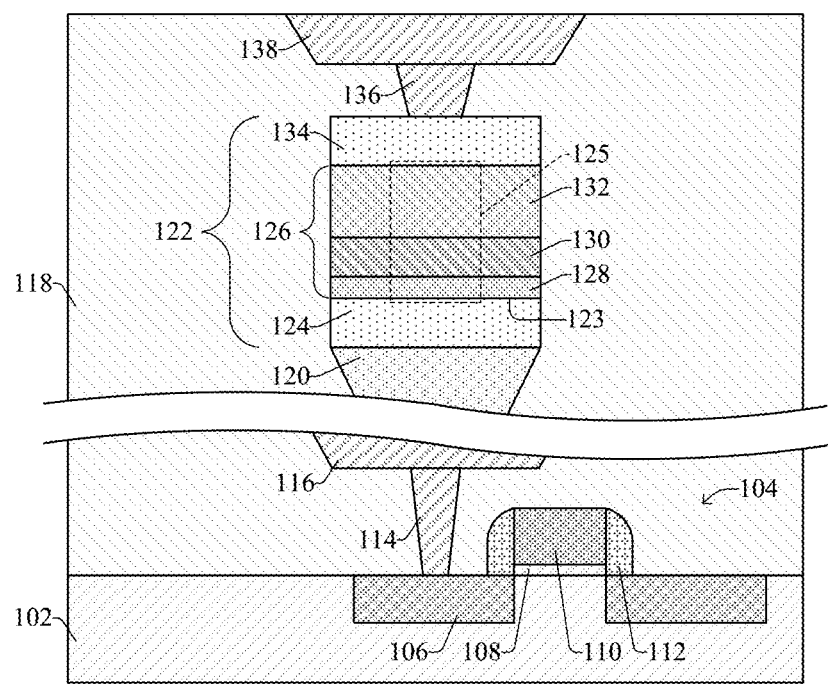
FIG. 1 illustrates a cross-sectional view of some embodiments of a memory device including a data storage structure with three data storage layers.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage structure (e.g., one or more oxide layer(s)) arranged between top and bottom electrodes. A variable resistance of the data storage structure represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

Before an RRAM cell can be used to store data, an initial conductive path (i.e., conductive filament) is typically formed across the data storage structure. Formation of the initial conductive path makes subsequent write operations (that form the conductive path) easier to perform. To form the initial conductive path, at the end of the RRAM manufacturing process a forming voltage is applied across the top and bottom electrodes. In some types of RRAM cells, the conductive path may include vacancies (e.g., oxygen vacancies). In such devices the forming voltage may knock oxygen atoms out of a lattice of the data storage structure, thereby forming localized oxygen vacancies. These localized oxygen vacancies tend to align to form the conductive path which extends through the data storage structure. Thereafter, set or reset voltages can be applied across the top and bottom electrodes to change resistivity of the data storage structure. For example, when a reset voltage is applied, oxygen atoms move back to the data storage structure, thereby filling oxygen vacancies and breaking the conductive path to increase resistivity. In yet another example, when a set voltage is applied, oxygen atoms in the data storage structure move to the top electrode, thereby leaving oxygen vacancies and re-forming the conductive path to lower resistivity.

In an RRAM cell, the data storage structure may typically comprise a first data storage layer and a second data storage layer. The first data storage layer is disposed along the bottom electrode and the second data storage layer is disposed along the top electrode. The first data storage layer comprises a first dielectric material with a first bandgap and the second data storage layer comprises a second dielectric material with a second bandgap greater than the first bandgap, where the first and second dielectric materials each comprise an oxide. Due to a difference in the first and second bandgaps, during formation of the conductive path a greater number of oxygen vacancies may form in the second data storage layer than in the first data storage layer. This in turn facilities controlling a size of the conductive path, such that a width of the conductive path increases from the first data storage layer to the second data storage layer. However, it has been appreciated that after performing a number of set and/or reset operations, a greater number of oxygen vacancies may form in the first data storage layer, for example, along an interface between the first data storage layer and the bottom electrode. This may occur because of heat that accumulates at the interface during the number of set and/or reset operations, where the accumulation of the heat facilitates forming additional oxygen vacancies in the first data storage layer (i.e., the accumulated heat may break a bond between oxygen atoms and metal atoms in the first dielectric material). This may mitigate an ability for the RRAM cell to switch between discrete data states and/or cause device failure after a number of switching cycles (e.g., after about $2 \times 10^5$ switching cycles).

The present disclosure, in some embodiments, is directed to an RRAM cell that has a data storage structure comprised of a first data storage layer, a second data storage layer, and a third data storage layer. The first data storage layer is disposed along the bottom electrode, the third data storage layer is disposed along the top electrode, and the second data storage layer is disposed between the first and third data storage layers. The first data storage layer comprises a first dielectric material with a first bandgap and the second data storage layer comprises a second dielectric material with a second bandgap greater than the first bandgap. Further, the third data storage layer comprises a third dielectric material with a third bandgap greater than the second bandgap. Thus, a width of a conductive path formed within the data storage structure is constricted by the first data storage layer and increases from the bottom electrode to the top electrode. Further, the first data storage layer has a strong bond (e.g., greater than about 600 kilojoules per mole (kJ/mol)) between metal atoms and oxygen atoms within the first dielectric material. The strong bond facilitates increasing the number of set and/or reset operations that may be performed on the RRAM cell because the strong bond may persist (i.e., be unbroken) through high temperatures that accumulate at an interface between the first data storage layer and the bottom electrode. This in turn increases a number of switching cycles (e.g., greater than $5 \times 10^5$ switching cycles), data retention, and reliability of the RRAM cell.

FIG. 1 illustrates a cross-sectional view of some embodiments of a memory device 100 including a memory cell 122 that has a data storage structure 126 comprising a first data storage layer 128, a second data storage layer 130, and a third data storage layer 132.

The memory device 100 includes the memory cell 122 disposed over a substrate 102. An interconnect dielectric structure 118 comprising one or more inter-level dielectric (ILD) materials overlies the substrate 102. An access transistor 104 is within the substrate 102 and the interconnect dielectric structure 118. The access transistor 104 includes a gate electrode 110, a transistor sidewall spacer structure 112, a gate dielectric layer 108, and source/drain regions 106. One or more lower interconnect layers overlie the access transistor 104. According to various embodiments, the access transistor 104 may be configured as another semiconductor device. The one or more lower interconnect layers include a conductive contact 114 and a lower interconnect wire 116 disposed within the interconnect dielectric structure 118. A bottom electrode via 120 is disposed between the lower interconnect wire 116 and the memory cell 122, where the bottom electrode via 120 is configured to electrically couple the memory cell 122 to the one or more lower interconnect layers.

The memory cell 122 includes a bottom electrode 124, a top electrode 134, and the data storage structure 126 disposed between the bottom and top electrodes 124, 134. The data storage structure 126 includes the first data storage layer 128, the third data storage layer 132, and the second data storage layer 130 disposed between the first and third data storage layers 128, 132. The first data storage layer 128 comprises a first material with a first bandgap, the second data storage layer 130 comprises a second material with a second bandgap, and the third data storage layer 132 comprises a third material with a third bandgap. In some embodiments, the first material, the second material, and the third material are different from one another. In some embodiments, the first bandgap is less than the second bandgap, and the second bandgap is less than the third bandgap. Further, the first data storage layer 128 has a strong bond strength (e.g., greater than 600 kilojoules per mole (kJ/mol)) between metal atoms and oxygen atoms within the first material. Other bond strengths are, however, amenable. A conductive via 136 overlies the top electrode 134 and electrically couples the memory cell 122 to a conductive wire 138. In some embodiments, the memory cell 122 may be configured as a resistive random access memory (RRAM) cell, such that the data storage structure 126 comprises material(s) having a variable resistance configured to undergo a reversible phase change between a high resistance state and a low resistance state. It will be appreciated that the memory cell 122 being configured as another memory device (e.g., phase-change RAM (PCRAM), etc.) is within the scope of the disclosure. In further embodiments, the memory cell 122 and the access transistor 104 may be configured in a one transistor-one resistive memory cell (e.g., 1T1R) configuration.

During operation, the memory cell 122 relies on redox reactions to form and dissolve a conductive path in a region 125 of the data storage structure 126 between the top and bottom electrodes 134, 124. The existence of the conductive path in the region 125 between the top and bottom electrodes 134, 124 produces a low resistance state, while the absence of the conductive path in the region 125 results in a high resistance state. Thus, the memory cell 122 can be switched between the high resistance state and low resistance state by applying appropriate biases to the memory cell 122 to produce or dissolve the conductive path in the region 125. In some embodiments, the top electrode 134 is configured to receive a programming voltage (e.g., a forming voltage, a set voltage, a reset voltage, etc.) and the bottom electrode 124 is configured to receive a reference voltage (e.g., a ground voltage, 0 volts, etc.). In various embodiments, the memory cell 122 may be switched between the high resistance state and the low resistance state by applying the programming voltage to the top electrode 134 and the reference voltage to the bottom electrode 124.

To increase a number of switching cycles that may be performed on the memory cell 122, the first bandgap is less than the second bandgap and the second bandgap is less than the third bandgap. During removal of the conductive path in region 125 (i.e., a "reset" operation), by virtue of the decreasing bandgaps from the third data storage layer 132 to the first data storage layer 128, a number of oxygen atoms that are removed from the first data storage layer 128 is less than a number of oxygen atoms that are removed from the third data storage layer 132. Thus, a width of the conductive path increases when traveling from the bottom electrode 124 to the top electrode 134, such that the conductive path is constricted by the first data storage layer 128. Thus, a majority of the oxygen vacancies within the data storage structure 126 are located near the top electrode 134, thereby making it easier for the oxygen atoms to flow from or flow to the top electrode 134 during the switching cycles. This in turn increases discrete data states, a reliability, and an endurance of the memory cell 122.

In further embodiments, while performing switching operations on the memory cell 122, heat may accumulate along an interface 123 between the first data storage layer 128 and the bottom electrode 124. In some embodiments, if the bond strength between the metal atoms and oxygen atoms within the first material is less than about 600 kJ/mol, then the heat accumulating along the interface 123 may assist in breaking bonds within the first material, thereby degrading an ability to switch between the high resistance the low resistance. This in turn may be because as more switching operations are performed, more oxygen atoms may break from the metal atoms within the first data storage layer 128 and travel to the top electrode 134, thereby decreasing data retention and/or an endurance of the memory cell 122. In further embodiments, if the bond strength between the metal atoms and oxygen atoms within the first material is greater than about 600 kJ/mol, then the bond between the metal atoms and the oxygen atoms may not be affected by the accumulation of heat along the interface 123. This in turn may increase a number of switching operations that may be performed on the memory cell 122, thereby increasing data retention, endurance, and/or discrete data states of the memory cell 122.

In some embodiments, the second and/or third data storage layers 130, 132 may, for example, each be or comprise hafnium oxide, aluminum oxide, silicon oxide, zirconium oxide, hafnium titanium oxide, hafnium tantalum oxide, tantalum aluminum oxide, hafnium zirconium oxide, tantalum zirconium oxide, hafnium cerium oxide, zirconium cerium oxide, a combination of the foregoing, or the like. Other materials are, however, amenable. In some embodiments, the first data storage layer 128 may, for example, be or comprise titanium oxide (e.g., $TiO_2$), tantalum oxide, cerium oxide, tantalum oxynitride, hafnium tantalum oxide, hafnium tantalum oxynitride, hafnium cerium oxide, hafnium cerium oxynitride, titanium oxynitride, cerium oxynitride, tantalum oxycarbide, titanium oxycarbide, titanium oxynitride carbide (TiON(C)), tantalum oxynitride carbide (TaON(C)), hafnium tantalum oxycarbide, tantalum titanium oxynitride, tantalum titanium oxycarbide, a combination of the foregoing, or the like and/or have a thickness within a range of about 5 to 20 Angstroms. It will be appreciated that other values for the thickness of the first data storage layer 128 are also within the scope of the disclosure. Further, other materials are, however, amenable. In some embodiments, the second data storage layer 130 may have a thickness within a range of about 5 to 20 Angstroms. It will be appreciated that other values for the thickness of the second data storage layer 130 are also within the scope of the disclosure. In further embodiments, the third data storage layer 132 may have a thickness within a range of about 10 to 40 Angstroms. It will be appreciated that other values for the thickness of the third data storage layer 132 are also within the scope of the disclosure.

In further embodiments, the first data storage layer 128 may comprise titanium oxide (e.g., $TiO_2$), thereby having a bandgap of about 3.3 electronvolt (eV) and a bond strength (between metal and oxygen atoms) of about 662 kJ/mol, the second data storage layer 130 may comprise hafnium oxide (e.g., $HfO_2$), thereby having a bandgap of about 5.5 eV, and the third data storage layer 132 may comprise aluminum oxide (e.g., $Al_2O_3$), thereby having a bandgap of about 8.5 eV. Thus, in such embodiments, the bandgap of the first data storage layer 128 is less than the bandgap of the second and third data storage layers 130, 132 and the first data storage layer 128 has a strong bond strength (e.g., greater than 600 kJ/mol). Therefore, in some embodiments, the respective bandgaps of the first, second, and third data storage layers 128-132 gradually decrease from the top electrode 134 to the bottom electrode 124. In further embodiments, the first data storage layer 128 may comprise a material with a bandgap less than about 4.5 eV, the second data storage layer 130 may comprise a material with a bandgap within a range of about 3.5 to 5.5 eV, and the third data storage layer 132 may comprise a material with a bandgap greater than about 4 eV. In some embodiments, if the bandgap of the first data storage layer 128 is greater than about 4.5 eV, then a greater number of the bonds between the metal atoms and the oxygen atoms may be broken in the first data storage layer 128 than in the second data storage layer 130 and/or the third data storage layer 132, such that the conductive path in the data storage structure 126 may not be constrained by the first data storage layer 128. This in turn may reduce a number of switching operations that may be performed on the memory cell 122. Further, it will be appreciated that other values for the respective bandgaps of the first, second and third data storage layers 128-132 are also within the scope of the disclosure.

In yet further embodiments, a vertical layout of the first, second, and third data storage layers 128-132 may be inverted (not shown). For example, in some embodiments, the first data storage layer 128 may be disposed along a bottom surface of the top electrode 134, the third data storage layer 132 may be disposed along a top surface of the bottom electrode 124 (i.e. underlying the first data storage layer 128), and the second data storage layer 130 may be disposed between the first and third data storage layers 128, 132. In such embodiments, the respective bandgaps of the first, second, and third data storage layers 128-132 may gradually increase from the top electrode 134 to the bottom electrode 124. Thus, in various embodiments, respective bandgaps of the first, second, and third data storage layers 128-132 may gradually decrease or increase from the top electrode 134 to the bottom electrode 124, where the top electrode 134 is configured to receive a programming voltage (e.g., a forming voltage, a set voltage, a reset voltage, etc.) and the bottom electrode is configured to receive a reference voltage (e.g., a ground voltage, 0 volts, etc.).

Figure 2:
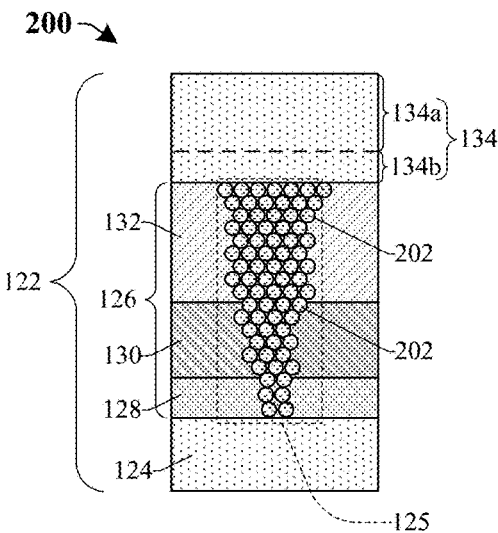
FIGS. 2-4 illustrate cross-sectional views of some embodiments of operating a memory device including a data storage structure with three data storage layers.
Figure 3:
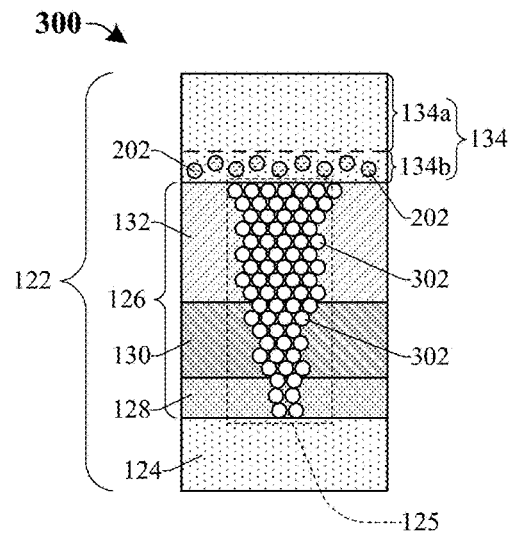
Figure 4:
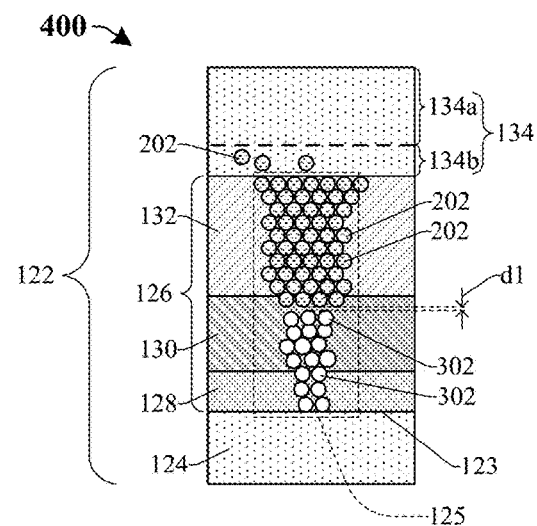

FIGS. 2-4 illustrate cross-sectional views of some embodiments of different states of the memory cell 122 of FIG. 1. In some embodiments, FIG. 2 illustrates a first state 200, in which a forming operation has not been performed on the memory cell 122 and/or the memory cell 122 is in a high resistance state (e.g., storing a logical "0"). In further embodiments, FIG. 3 illustrates a second state 300, in which a forming operation has been performed on the memory cell 122 and/or the memory cell 122 is in a low resistance state (e.g., storing a logical "1"). In yet further embodiments, FIG. 4 illustrates a third state 400, in which the memory cell 122 is in a high resistance state (e.g., storing a logical "0"). In various embodiments, during the different states of the memory cell 122 of FIGS. 2-4, the top electrode 134 is configured to receive a programming voltage (e.g., a forming voltage, a set voltage, a reset voltage, etc.) and the bottom electrode 124 is configured to receive a reference voltage (e.g., a ground voltage, 0 volts, etc.), or vice versa.

Although FIGS. 2-4 describe a memory cell as having a conductive path formed of oxygen vacancies, it will be appreciated that the disclosed data storage structure is not limited to memory devices having such paths. For example, in some embodiments, the data storage structure may be used in memory devices having a conductive path that is formed of conductive ions and not oxygen vacancies or a conductive path that is formed of oxygen vacancies and conductive ions.

FIG. 2 illustrates one embodiment of the first state 200 of the memory cell 122. In some embodiments, the first state 200 illustrates the memory cell 122 before performing a forming operation on the memory cell 122. The data storage structure 126 comprises the first data storage layer 128, the second data storage layer 130, and the third data storage layer 132. In some embodiments, the first, second, and/or third data storage layers 128-132 may each, for example, comprise an oxide, such as a metal oxide, a high-k dielectric material, another suitable dielectric material, or the like. As used herein, a high-k dielectric material is a dielectric material with a dielectric constant greater than 3.9. Thus, the first, second, and third data storage layers 128-132 comprise a plurality of oxygen atoms 202 distributed across each layer. It will be appreciated that there may be any number of oxygen atoms distributed across the data storage structure 126 in many different locations, thus FIG. 2 is merely an example that may not illustrate some present oxygen atoms for ease of illustration. Further, because a forming operation has not been performed on the memory cell 122, the first state 200 illustrates the memory cell 122 in a high resistance state. In some embodiments, the top electrode 134 may include a metal layer 134a (e.g., comprising titanium, tantalum, tungsten, a metal nitride of the foregoing, etc.) overlying a metal oxide layer 134b (e.g., titanium oxide, tantalum oxide, tungsten oxide, etc.).

FIG. 3 illustrates one embodiment of the second state 300 of the memory cell 122, in which a forming operation or a set operation was performed on the memory cell 122. In some embodiments, during the forming operation, the metal oxide layer 134b is configured to receive the oxygen atoms 202 from the data storage structure 126, thereby forming vacancies 302 (e.g., oxygen vacancies) in the data storage structure 126. In further embodiments, the vacancies 302 may span from the top electrode 134 to the bottom electrode 124, thereby defining a conductive path within the region 125, such that the memory cell 122 is in a low resistance state.

In some embodiments, the first data storage layer 128 comprises a first material with a first bandgap, the second data storage layer 130 comprises a second material with a second bandgap, and the third data storage layer 132 comprises a third material with a third bandgap. In some embodiments, the first material, the second material, and the third material are all different from one another. In addition, in some embodiments, the first bandgap is less than the second bandgap and the second bandgap is less than the third bandgap. By virtue of the decreasing bandgap levels (from the top electrode 134 to the bottom electrode 124) and/or a proximity of the first, second, and third data storage layers 128-132 to the top electrode 134, a number of oxygen atoms 202 that are removed from the first data storage layer 128 is less than a number of oxygen atoms 202 that are removed from the third data storage layer 132. Further, a number of oxygen atoms 202 that are removed from the second data storage layer 130 is greater than the number of oxygen atoms 202 removed from the first data storage layer 128 and is less than the number of oxygen atoms 202 removed from the third data storage layer 132. Thus, a width of the conductive path disposed within the region 125 decreases when traveling from the top electrode 134 to the bottom electrode 124, such that the width of the conductive path is constricted by the first data storage layer 128. Therefore, a majority of the vacancies 302 within the data storage structure 126 are located near the top electrode 134, thereby making it easier for the oxygen atoms 202 to flow from or flow to the top electrode 134 during subsequent switching cycles. This in turn increases data retention, a reliability, and an endurance of the memory cell 122.

FIG. 4 illustrates one embodiment of the third state 400 of the memory cell 122, in which a reset operation was performed on the memory cell 122. In some embodiments, the third state 400 is the state of the memory cell 122 after applying appropriate reset bias conditions between the top electrode 134 and the bottom electrode 124, such that the memory cell 122 is in a high resistance state. This in turn dissolves and/or removes at least a portion of the conductive path within the region 125, such that the conductive path may not extend continuously from the top electrode 134 to the bottom electrode 124. As shown in FIG. 4, a majority of the vacancies 302 of FIG. 3 are filled by a corresponding oxygen atom 202. In some embodiments, the oxygen atoms 202 may travel from the top electrode 134 to fill the vacancies 302 that are disposed within the data storage structure 126. In further embodiments, all of the vacancies 302 of FIG. 4 are filled by a corresponding oxygen atom 202 (not shown).

In some embodiments, after performing a number of switching cycles heat may accumulate at an interface 123 between the first data storage layer 128 and the bottom electrode 124. In order to mitigate and/or eliminate degradation of the conductive path within the region 125, the first material of the first data storage layer 128 has a high bond strength (e.g., greater than about 600 kJ/mol) between the metal atoms and oxygen atoms within the first material. This in turn prevents and/or mitigates the accumulated heat from breaking the bond between the oxygen atoms and the metal atoms within the first material, thereby preventing a formation of additional vacancies within the first data storage layer 128 as the number of switch cycles increases. Therefore, the first data storage layer 128 comprising a low bandgap (e.g., less than about 4.5 eV) and a high bond strength between the metal atoms and oxygen atoms within the first material increases a number of switching operations that may be performed on the memory cell 122 and increases data retention of the memory cell 122.

In some embodiments, the vacancies 302 continuously extend from the bottom electrode 124 to a point below an upper surface of the second data storage layer 130. Thus, the vacancies 302 may continuously extend from the first data storage layer 128 to the second data storage layer 130 after performing the reset operation on the memory cell 122. In some embodiments, the vacancies 302 are vertically offset from the oxygen atoms 202 by a distance d1. In such embodiments, the distance d1 is non-zero. In yet further embodiments, the vacancies 302 directly contact the oxygen atoms 202 (not shown), in which the distance d1 is zero. In various embodiments, the oxygen atoms 202 between the top electrode 134 and the vacancies 302 ensure the bottom electrode 124 is not directly electrically coupled to the top electrode 134 after performing the reset operation. In yet further embodiments, vacancies 302 are not preset within the third data storage layer 132 after performing the reset operation of the memory cell 122.

Figure 5:
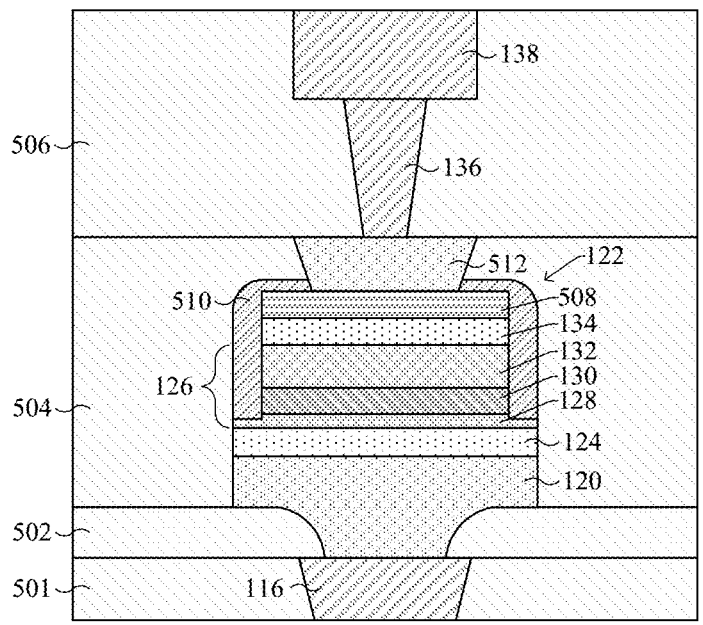
FIGS. 5 and 6 illustrate cross-sectional views of some alternative embodiments of the memory device of FIG. 1.

FIG. 5 illustrates a cross-sectional view of a memory device 500 corresponding to some alternative embodiments of the memory device 100 of FIG. 1.

The memory device 500 includes a lower dielectric layer 502 and a lower ILD layer 501 underlying the lower dielectric layer 502. In some embodiments, the lower ILD layer 501 may, for example, be or comprise an oxide, such as silicon dioxide, a low-k dielectric material, another suitable dielectric material, or any combination of the foregoing. A lower interconnect wire 116 is disposed within the lower ILD layer 501. In some embodiments, the lower interconnect wire 116 may, for example, be or comprise tungsten, copper, aluminum, a combination of the foregoing, or the like. Other materials are, however, amenable. A bottom electrode via 120 overlies the lower dielectric layer 502 and extends through the lower dielectric layer 502 to contact the lower interconnect wire 116. In some embodiments, the bottom electrode via 120 may, for example, be or comprise titanium, aluminum, tungsten, copper, a combination of the foregoing, or the like. Other materials are, however, amenable.

A first ILD layer 504 overlies and surrounds the bottom electrode via 120, and a second ILD layer 506 overlies the first ILD layer 504. In some embodiments, the first and/or second ILD layers 504, 506 may, for example, each be or comprise an oxide, such as silicon dioxide, a low-k dielectric material, a combination of the foregoing, or another suitable dielectric material. The memory cell 122 is disposed within the first ILD layer 504 and overlies the bottom electrode via 120. The memory cell 122 includes a capping layer 508, a top electrode 134, a bottom electrode 124, and a data storage structure 126 disposed between the top and bottom electrodes 134, 124. The data storage structure 126 may include a first data storage layer 128, a second data storage layer 130, and a third data storage layer 132. In some embodiments, a thickness of the first data storage layer 128 is less than a thickness of the second data storage layer 130 and the thickness of the second data storage layer 130 is less than a thickness of the third data storage layer 132. In some embodiments, the first data storage layer 128, the second data storage layer 130, and the third data storage layer 132 may each, for example, be or comprise a high-k dielectric material. Other materials are, however, amenable. Further, a sidewall spacer structure 510 is disposed within the first ILD layer 504 and laterally surrounds sidewalls of the memory cell 122.

In some embodiments, the top and/or bottom electrodes 134, 124 may, for example, each be or comprise titanium, titanium nitride, tantalum nitride, tantalum, tungsten, tungsten nitride, a combination of the foregoing, or the like. Other materials are, however, amenable. In some embodiments, the capping layer 508 may, for example, be or comprise hafnium, titanium, tantalum, aluminum, zirconium, a combination of the foregoing, or the like. In some embodiments, the second and/or third data storage layers 130, 132 may, for example, each be or comprise hafnium oxide, aluminum oxide, silicon oxide, zirconium oxide, hafnium titanium oxide, hafnium tantalum oxide, tantalum aluminum oxide, hafnium zirconium oxide, tantalum zirconium oxide, hafnium cerium oxide, zirconium cerium oxide, a combination of the foregoing, or the like. In some embodiments, the first data storage layer 128 may, for example, be or comprise titanium oxide (e.g., $TiO_2$), tantalum oxide, cerium oxide, tantalum oxynitride, hafnium tantalum oxide, hafnium tantalum oxynitride, hafnium cerium oxide, hafnium cerium oxynitride, titanium oxynitride, cerium oxynitride, tantalum oxycarbide, titanium oxycarbide, a combination of the foregoing, or the like and/or have a thickness within a range of about 5 to 20 Angstroms. It will be appreciated that other values for the thickness of the first data storage layer 128 are also within the scope of the disclosure. Further, other materials are, however, amenable. In some embodiments, the sidewall spacer structure 510 may, for example, be or comprise silicon nitride, silicon carbide, or the like. Other materials are, however, amenable.

Further, a top electrode via 512 is disposed along an upper surface of the first ILD layer 504 and overlies the capping layer 508. In some embodiments, the top electrode via 512 may, for example, be or comprise tungsten, titanium, tantalum, a combination of the foregoing, or the like. Other materials are, however, amenable. In some embodiments, the top electrode via 512 directly contacts the capping layer 508. Further, a conductive via 136 and a conductive wire 138 are disposed within the second ILD layer 506. In some embodiments, the conductive via and wire 136, 138 may, for example, each be or comprise aluminum, copper, tungsten, titanium, a combination of the foregoing, or the like. Other materials are, however, amenable.

Figure 6:
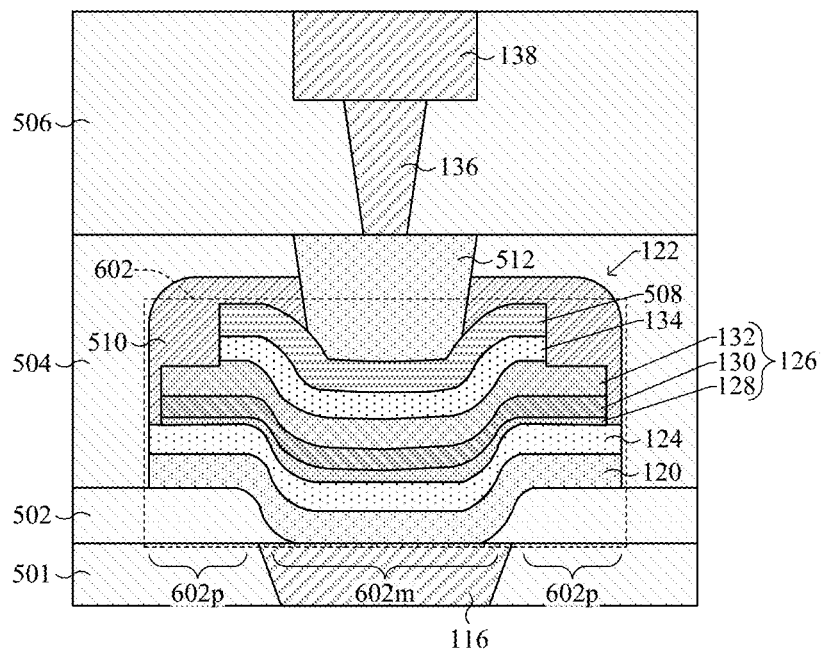

FIG. 6 illustrates a cross-sectional view of a memory device 600 corresponding to some alternative embodiments of the memory device 100 of FIG. 1.

The memory cell 122 contains a film stack 602 comprising: the bottom electrode via 120, the bottom electrode 124, the first data storage layer 128, the second data storage layer 130, the third data storage layer 132, the top electrode 134, and the capping layer 508. The film stack 602 comprises a middle region 602m over the lower interconnect wire 116 and a peripheral region 602p laterally offset from the top electrode via 512. A bottom surface of the middle region 602m of the film stack 602 is below a bottom surface of the peripheral region 602p of the film stack 602.

In some embodiments, the layers within the film stack 602 are respectively non-planar. This is because the layers are disposed within/over a trench defined by sidewalls of the lower dielectric layer 502. For example, the bottom electrode via 120 continuously extends from a top surface of the lower dielectric layer 502 and along a sidewall of the lower dielectric layer 502 to a top surface of the lower interconnect wire 116. Further, layers within the film stack 602 that overlie the bottom electrode via 120 conform to a shape of the bottom electrode via 120. Thus, the bottom electrode 124, the first data storage layer 128, the second data storage layer 130, the third data storage layer 132, the top electrode 134, and the capping layer 508 are respectively non-planar.

Figure 7:
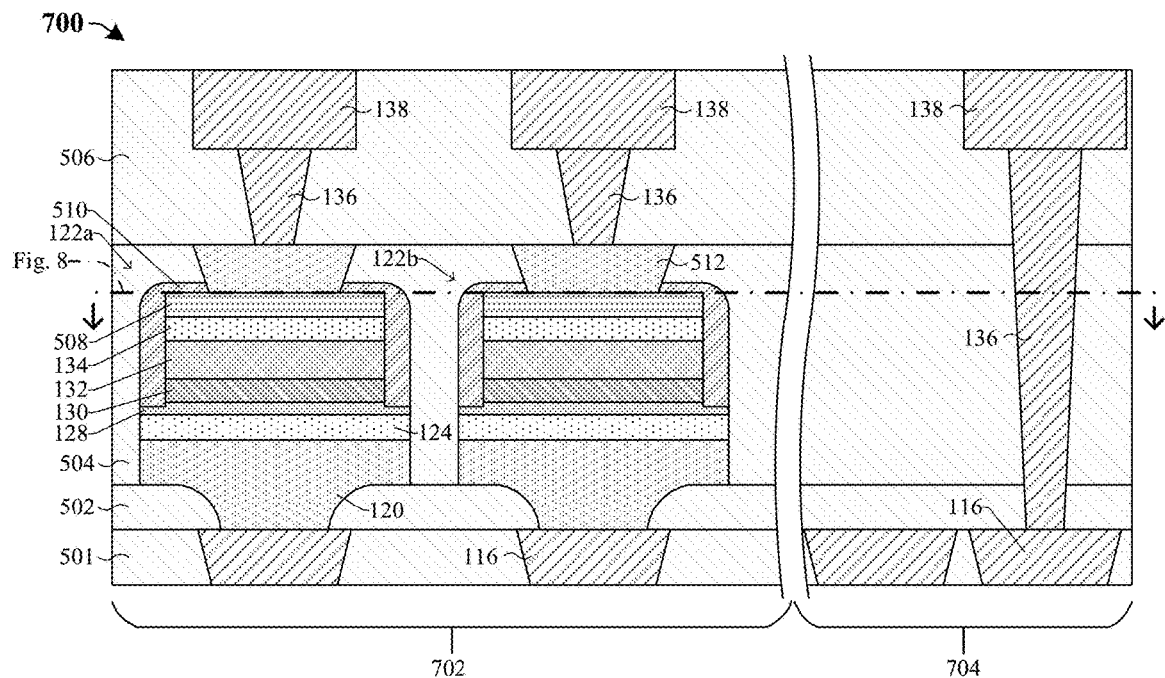
FIG. 7 illustrates a cross-sectional view of some embodiments of an integrated chip including memory cells disposed within an embedded memory region that is laterally adjacent to a logic region.

FIG. 7 illustrates a cross-sectional view of some embodiments of an integrated chip 700 including a first memory cell 122a and a second memory cell 122b laterally disposed within an embedded memory region 702, in which the embedded memory region 702 is laterally adjacent to a logic region 704.

In some embodiments, the first and/or second memory cells 122a-b are respectively configured as the memory cell 122 of FIG. 5. The first and second memory cells 122a-b are laterally offset from the logic region 704. In some embodiments, the logic region 704 comprises lower interconnect wires 116 disposed within the lower ILD layer 501. Further, a conductive via 136 is disposed within the logic region 704 and vertically extends from a conductive wire 138 to a lower interconnect wire 116.

Figure 8:
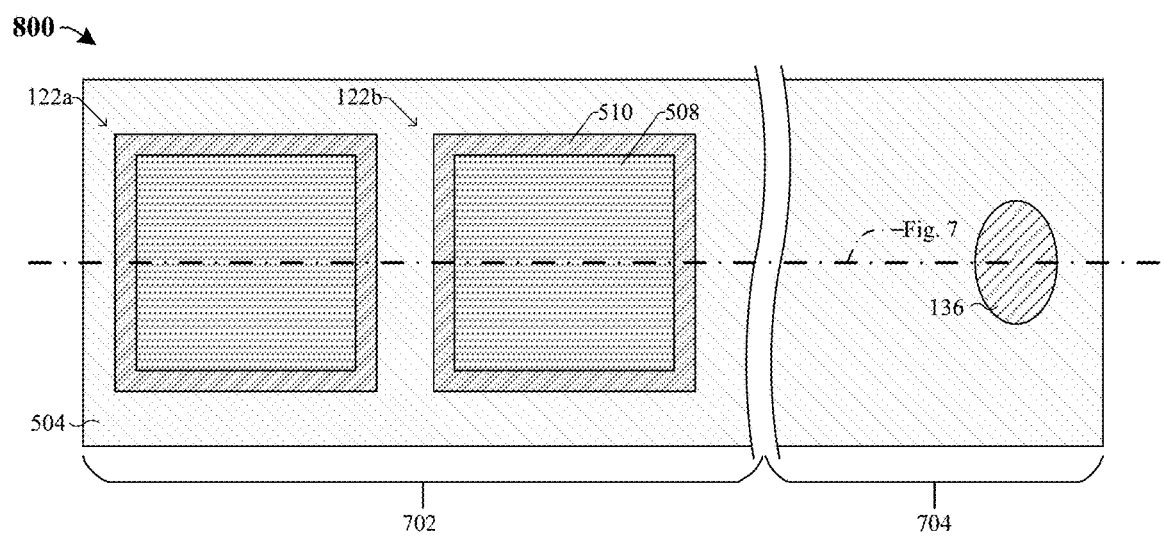
FIG. 8 illustrates a top view of some alternative embodiments of the integrated chip of FIG. 7 according to the line in FIG. 7.

FIG. 8 illustrates a top view 800 of some embodiments of the integrated chip 700 of FIG. 7 taken along the line in FIG. 7.

In some embodiments, as illustrated in FIG. 7, when viewed from above the first and/or second memory cells 122a-b each have a square shape. In some embodiments, when viewed from above the first and/or second memory cells 122a-b may each have a rectangular shape, a circular shape, an elliptical shape, or another suitable shape. Further, the sidewall spacer structure 510 laterally encloses the capping layer 508. In further embodiments, the conductive via 136 within the logic region 704 may, for example, have an elliptical or circular shape when viewed from above.

Figure 9:
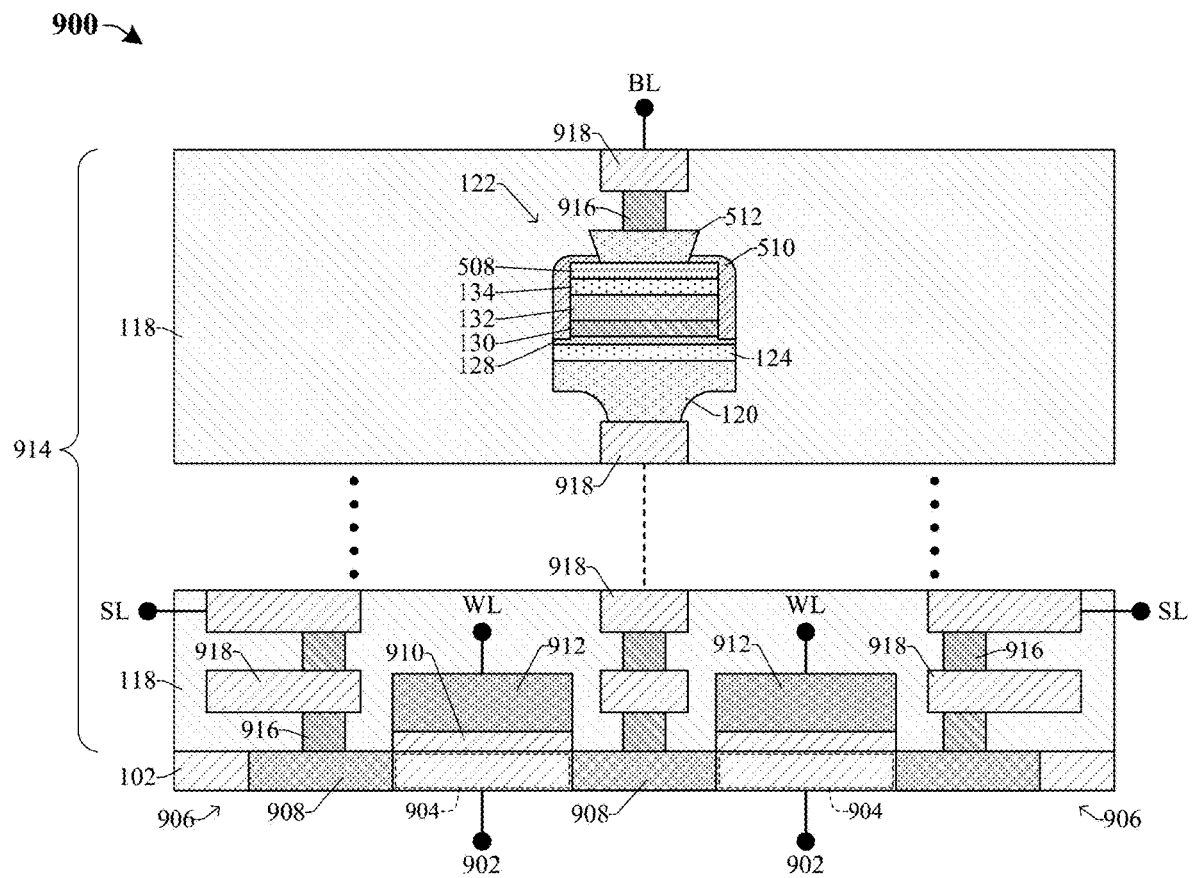
FIG. 9 illustrates a cross-sectional view of some embodiments of an integrated chip comprising a memory cell that includes a data storage structure with three data storage layers disposed within an interconnect structure.

FIG. 9 illustrates a cross-sectional view of some embodiments of an integrated chip 900 comprising a memory cell 122 disposed within an interconnect structure 914.

The integrated chip 900 includes the interconnect structure 914 overlying a substrate 102. The substrate 102 may, for example, be or comprise a bulk substrate (e.g., a bulk silicon substrate) or a silicon-on-insulator (SOI) substrate. Semiconductor devices 906 are disposed within and/or on the substrate 102. In some embodiments, the semiconductor devices 906 may be configured as metal-oxide-semiconductor field-effect transistors (MOSFETs). In such embodiments, the semiconductor devices 906 each comprise source/drain regions 908 disposed within the substrate 102 and laterally spaced apart from one another. A gate dielectric layer 910 overlies the substrate 102 between the source/drain regions 908, and a gate electrode 912 overlies the gate dielectric layer 910. In some embodiments, the gate electrode 912 may, for example, be or comprise polysilicon, a metal material, such as aluminum, titanium, a combination of the foregoing, or another suitable conductive material. In some embodiments, the substrate 102 comprises a first doping type (e.g., p-type) and the source/drain regions 908 comprise a second doping type (e.g., n-type) opposite the first doping type. In some embodiments, the source/drain regions 908 comprise a doping concentration greater than a doping concentration of the substrate 102. It will be appreciated that, in some embodiments, the semiconductor devices 906 may respectively be configured as other field-effect transistor devices. A well region 904 is disposed between the source/drain regions 908 and comprises the first doping type with a higher doping concentration than the substrate 102.

The interconnect structure 914 comprises an interconnect dielectric structure 118 overlying the substrate 102 and the semiconductor devices 906. In some embodiments, the interconnect dielectric structure 118 comprises one or more ILD layers that are comprises of one or more ILD materials. In some embodiments, the one or more ILD materials may, for example, be or comprise silicon dioxide, a low-k dielectric material, a combination of the foregoing, or another suitable dielectric material. As used herein, a low-k dielectric material is a dielectric material with dielectric constant less than 3.9. A plurality of conductive wires 918 and conductive vias 916 are stacked within the interconnect dielectric structure 118 and are configured to provide electrical connections between various devices (e.g., the semiconductor devices 906 and/or the memory cell 122) disposed throughout the integrated chip 900. In some embodiments, the conductive wires 918 and/or the conductive vias 916 may, for example, respectively be or comprise copper, aluminum, tungsten, titanium, a combination of the foregoing, or some other suitable conductive material.

The memory cell 122 is disposed within the interconnect dielectric structure 118 of the interconnect structure 914. In some embodiments, the memory cell 122 includes a top electrode 134, a capping layer 508, a bottom electrode 124, a first data storage layer 128, a second data storage layer 130, and a third data storage layer 132. A bottom electrode via 120 extends from an underlying conductive wire 918 to the bottom electrode 124 and a top electrode via 512 extends from an overlying conductive via 916 to the capping layer 508. Further, a conductive wire 918 overlies the memory cell 122 and is electrically coupled to the top electrode 134 by way of the top electrode via 512. Further, a sidewall spacer structure 510 laterally wraps around sidewalls of the memory cell 122. In some embodiments, the memory cell 122 is configured as the memory cell 122 of FIG. 1, 5, or 6.

In some embodiments, the gate electrode 912 of the semiconductor devices 906 are each electrically coupled to a word line (WL), such that an appropriate WL voltage can be applied to the gate electrode 912 to electrically coupled the memory cell 122 to a source line (SL) and/or a bit line (BL). The SL is electrically coupled to a source/drain region 908 of one of the semiconductor devices 906 by way of the conductive vias 916 and the conductive wires 918. Further, the BL is electrically coupled to a common source/drain region 908 (e.g., a source/drain region shared by the semiconductor devices 906) by way of the conductive wires 918, conductive vias 916, and the memory cell 122. In some embodiments, the common source/drain region 908 is a source/drain region disposed laterally between and shared by the semiconductor devices 906. Thus, in some embodiments, an output of the BL and/or the memory cell 122 may be accessed at the SL upon application of the appropriate WL voltage. In further embodiments, a voltage may be applied at a transistor body node 902 that is electrically coupled to the well region 904 (i.e., a body of the semiconductor devices 906) disposed under the gate electrode 912. The voltage applied at the transistor body node 902 may be configured to assist in controlling a conductive channel formed in the well region 904. In further embodiments, the memory cell 122 and the semiconductor devices 906 may be configured in a two transistor-one resistive memory cell (e.g., 2T1R) configuration.

FIGS. 10-15 illustrate cross-sectional views 1000-1500 of some embodiments of a method of forming a memory device including a memory cell having a data storage structure with a first data storage layer, a second data storage layer, and a third data storage layer according to the present disclosure. Although the cross-sectional views 1000-1500 shown in FIGS. 10-15 are described with reference to a method, it will be appreciated that the structures shown in FIGS. 10-15 are not limited to the method but rather may stand alone separate of the method. Although FIGS. 10-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 10:
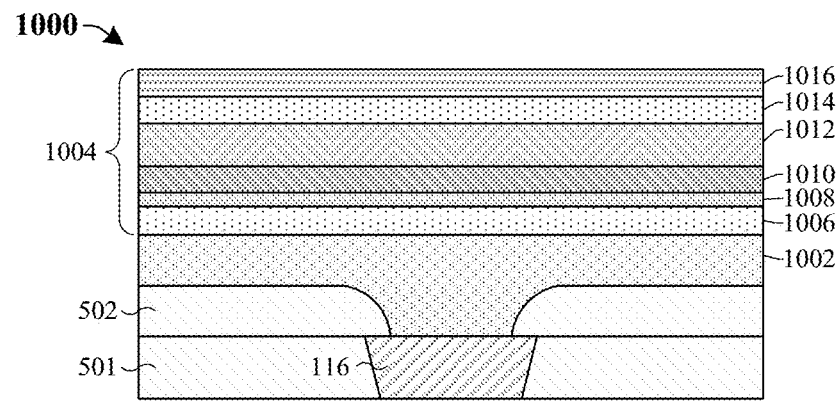
FIGS. 10-15 illustrate cross-sectional views of some embodiments of a method of forming a memory device including a data storage structure with three data storage layers.

As shown in cross-sectional view 1000 of FIG. 10, a lower interconnect wire 116 is formed within a lower ILD layer 501. A lower dielectric layer 502 is formed over the lower ILD layer 501. A bottom electrode via film 1002 is formed over the lower interconnect wire 116 and the lower dielectric layer 502. A memory cell film stack 1004 is formed over the bottom electrode via film 1002. The memory cell film stack 1004 includes: a bottom electrode film 1006, a first data storage film 1008, a second data storage film 1010, a third data storage film 1012, a top electrode film 1014, and a capping film 1016. In some embodiments, the layers of the memory cell film stack 1004 and/or the bottom electrode via film 1002 may respectively be formed by, for example, chemical vapor deposition (CVD), physical vapor deposition (PVD), atomic layer deposition (ALD), sputtering, electroless plating, electroplating, or another suitable growth or deposition process.

Figure 11:
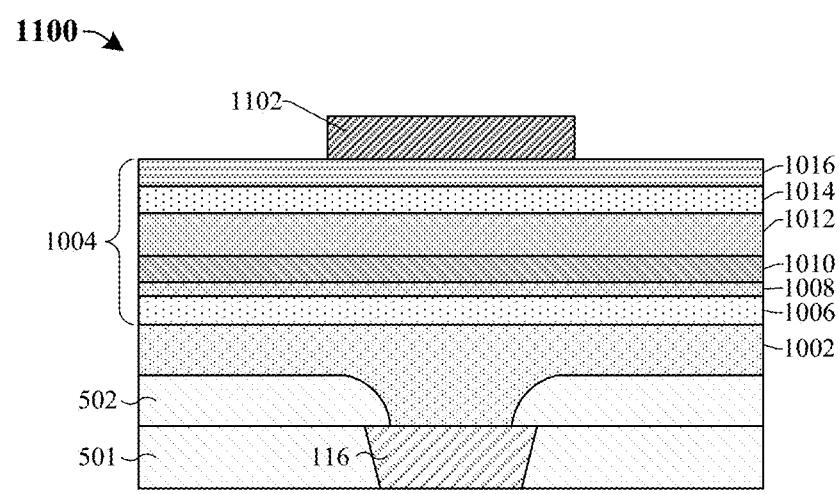

As shown in cross-sectional view 1100 of FIG. 11, a first masking layer 1102 is formed over the memory cell film stack 1004. In some embodiments, the first masking layer 1102 covers a middle region of the memory cell film stack 1004 and leaves a peripheral region of the memory cell film stack 1004 exposed.

Figure 12:
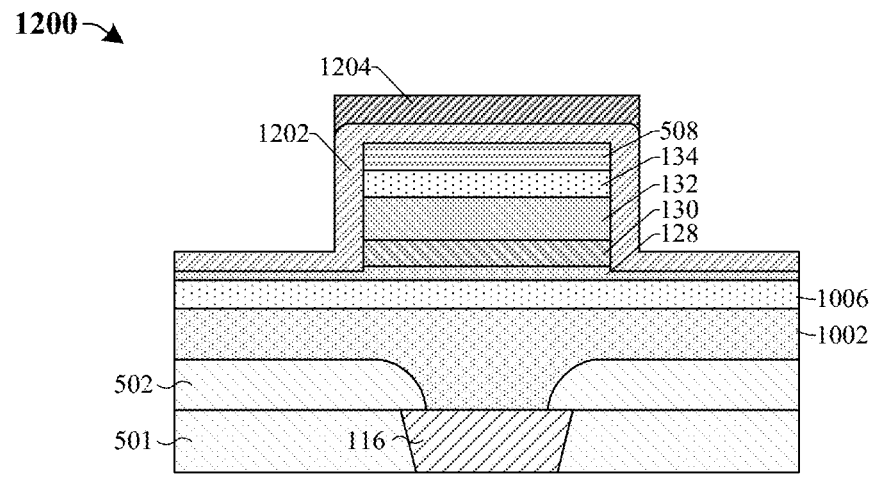

As shown in cross-sectional view 1200 of FIG. 12, the memory cell film stack (1004 of FIG. 11) is patterned according to the first masking layer (1102 of FIG. 11), thereby defining a first data storage layer 128, a second data storage layer 130, a third data storage layer 132, a top electrode 134, and a capping layer 508. In some embodiments, the patterning process may include: exposing unmasked regions of layers underlying the first masking layer (1102 of FIG. 11) to one or more etchants; and performing a removal process (not shown) to remove the first masking layer (1102 of FIG. 11). In some embodiments, the patterning process may etch through a portion of the first data storage layer 128, such that the first data storage layer 128 continuously extends along an upper surface of the bottom electrode film 1006 after performing the patterning process.

Also illustrated in FIG. 12, a passivation layer 1202 is formed over the capping layer 508 and the first data storage layer 128. In some embodiments, the passivation layer 1202 may, for example, be or comprise silicon carbide, silicon nitride, silicon oxynitride, or the like. Other materials are, however, amenable. In further embodiments, the passivation layer 1202 may be deposited by, for example, CVD, PVD, ALD, or another suitable deposition process. In addition, after forming the passivation layer 1202 a second masking layer 1204 is formed over the passivation layer 1202, in which the second masking layer 1204 overlies the capping layer 508.

Figure 13:
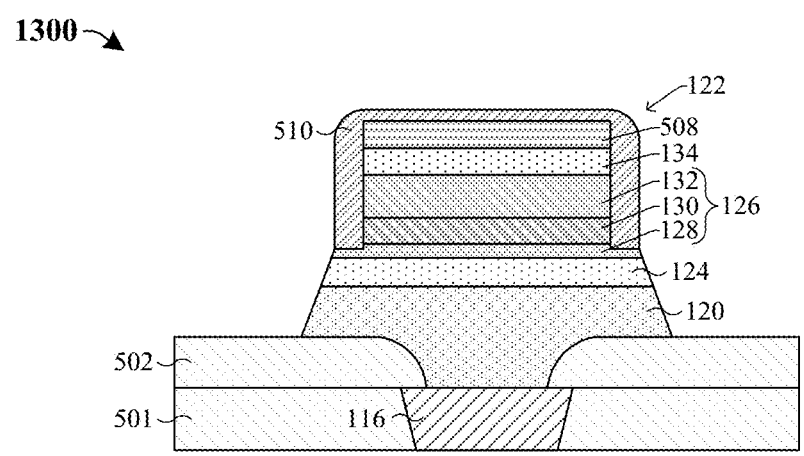

As shown in cross-sectional view 1300 of FIG. 13, a patterning process is performed on the structure of FIG. 12 according to the second masking layer (1204 of FIG. 12), thereby defining a data storage structure 126, a bottom electrode 124, a bottom electrode via 120, a sidewall spacer structure 510, and a memory cell 122. In some embodiments, the patterning process may include: exposing unmasked regions of the structure of FIG. 12 to one or more etchants; and performing a removal process to remove the second masking layer (1204 of FIG. 12). In some embodiments, the patterning process etches completely through the first data storage layer 128. In further embodiments, after the patterning process, the first data storage layer 128, the bottom electrode 124, and/or the bottom electrode via 120 each have slanted opposing outer sidewalls. In some embodiments, the data storage structure 126 includes the first data storage layer 128, the second data storage layer 130, and the third data storage layer 132. In further embodiments, the memory cell 122 includes the capping layer 508, the top electrode 134, the bottom electrode 124, and the data storage structure 126 disposed between the top and bottom electrodes 134, 124.

Figure 14:
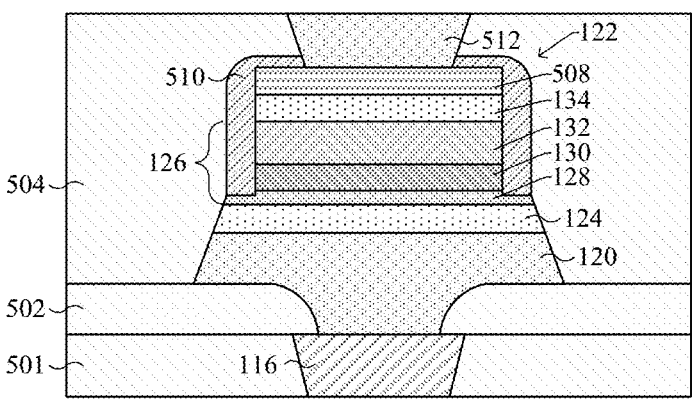

As shown in cross-sectional view 1400 of FIG. 14, a first ILD layer 504 is formed over and around the memory cell 122. In some embodiments, the first ILD layer 504 may, for example, be deposited by PVD, CVD, ALD, or another suitable deposition process. Further, a top electrode via 512 is formed over the memory cell 122, where the top electrode via 512 extends through the first ILD layer 504 and the sidewall spacer structure 510 to contact the capping layer 508. In some embodiments, the top electrode via 512 may be formed by, for example, CVD, PVD, electroless plating, electroplating, or another suitable deposition or growth process.

Figure 15:
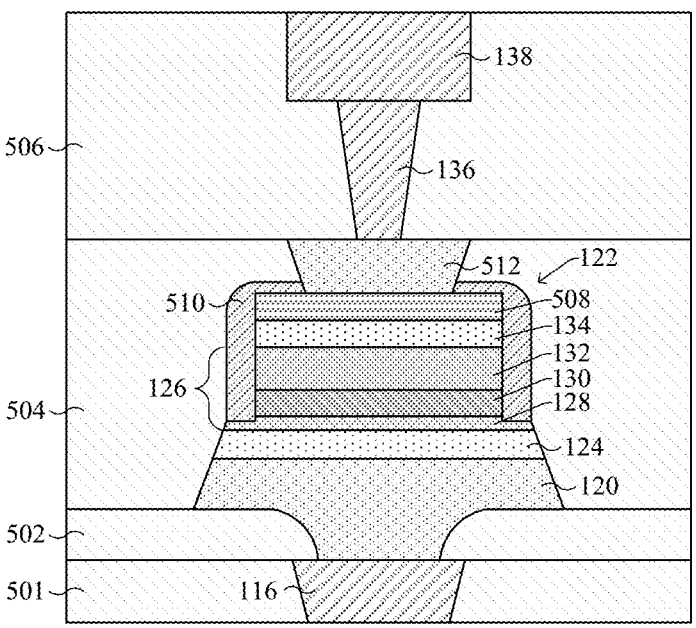

As shown in cross-sectional view 1500 of FIG. 15, a second ILD layer 506 is formed over the first ILD layer 504. In some embodiments, the second ILD layer 506 may be deposited by, for example, CVD, PVD, ALD, or another suitable deposition process. Further, a conductive via 136 and a conductive wire 138 are formed over the top electrode via 512. In some embodiments, the conductive via 136 and/or the conductive wire 138 may be formed by a single damascene process or may be formed by a dual damascene process.

Figure 16:
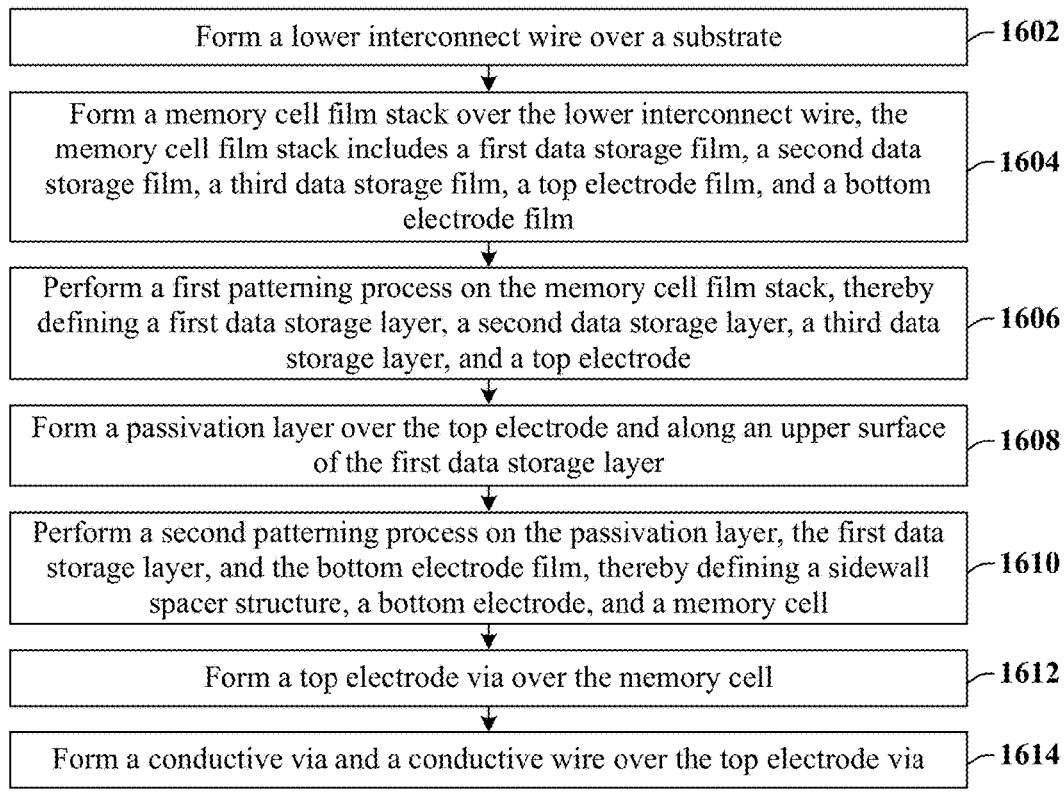
FIG. 16 illustrates a flowchart that illustrates some embodiments of a method for forming a memory device that includes a data storage structure with three data storage layers.

FIG. 16 illustrates a method 1600 of forming a memory device including a memory cell having a data storage structure with a first data storage layer, a second data storage layer, and a third data storage layer according to some embodiments of the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, a lower interconnect wire is formed over a substrate. FIG. 10 illustrates a cross-sectional view 1000 corresponding to some embodiments of act 1602.

At act 1604, a memory cell film stack is formed over the lower interconnect wire. The memory cell film stack includes a first data storage film, a second data storage film, a third data storage film, a top electrode film, and a bottom electrode film. FIG. 10 illustrates a cross-sectional view 1000 corresponding to some embodiments of act 1604.

At act 1606, a first patterning process is performed on the memory cell film stack, thereby defining a first data storage layer, a second data storage layer, a third data storage layer, and a top electrode. FIG. 12 illustrates a cross-sectional view 1200 corresponding to some embodiments of act 1606.

At act 1608, a passivation layer is formed over the top electrode and along an upper surface of the first data storage layer. FIG. 12 illustrates a cross-sectional view 1200 corresponding to some embodiments of act 1608.

At act 1610, a second patterning process is performed on the passivation layer, the first data storage layer, and the bottom electrode film, thereby defining a sidewall spacer structure, a bottom electrode, and a memory cell. FIG. 13 illustrates a cross-sectional view 1300 corresponding to some embodiments of act 1610.

At act 1612, a top electrode via is formed over the memory cell. FIG. 14 illustrates a cross-sectional view 1400 corresponding to some embodiments of act 1612.

At act 1614, a conductive via and a conductive wire are formed over the top electrode via. FIG. 15 illustrates a cross-sectional view 1500 corresponding to some embodiments of act 1614.

Accordingly, in some embodiments, the present disclosure relates to a memory cell comprising a top electrode, a bottom electrode, and a data storage structure disposed between the top and bottom electrodes. The data storage structure comprises a first data storage layer, a second data storage layer, and a third data storage layer, in which the first data storage layer has a lower bandgap than the second data storage layer and the second data storage layer has a lower bandgap than the third data storage layer.

In some embodiments, the present application provides a memory cell including a bottom electrode; a top electrode overlying the bottom electrode; and a data storage structure disposed between the top and bottom electrodes, wherein the data storage structure includes a first data storage layer, a second data storage layer, and a third data storage layer, wherein the second data storage layer is disposed between the first and third data storage layers, wherein the second data storage layer has a lower bandgap than the third data storage layer, and wherein the first data storage layer has a lower bandgap than the second data storage layer.

In some embodiments, the present application provides a memory device including a bottom electrode; a top electrode overlying the bottom electrode; a data storage structure disposed between the bottom electrode and the top electrode, wherein the data storage structure includes a first data storage layer contacting the bottom electrode and comprising a first material; a second data storage layer contacting the first data storage layer and comprising a second material different from the first material; a third data storage layer disposed between the second data storage layer and the top electrode, wherein the third data storage layer comprises a third material different from the first material and the second material; and wherein respective bandgaps of the first, second, and third data storage layers gradually decrease or increase from the top electrode to the bottom electrode, wherein the top electrode is configured to receive a programming voltage and the bottom electrode is configured to receive a reference voltage.

In some embodiments, the present application provides a method for forming a memory device, the method includes forming a lower interconnect wire over a substrate; forming a memory cell film stack over the lower interconnect wire, wherein the memory cell film stack includes a bottom electrode film, a first data storage film, a second data storage film, a third data storage film, and a top electrode film; patterning the memory cell film stack, thereby defining a top electrode, a bottom electrode, and a data storage structure disposed between the top and bottom electrodes, wherein the data storage structure comprises a first data storage layer, a second data storage layer, and a third data storage layer; and forming a conductive via and a conductive wire over the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a bottom electrode;
   a top electrode overlying the bottom electrode; and
   a data storage structure disposed between the top and bottom electrodes, wherein the data storage structure comprises a first data storage layer, a second data storage layer, and a third data storage layer, wherein the second data storage layer is disposed between the first and third data storage layers, wherein the second data storage layer has a lower bandgap than the third data storage layer, and wherein the first data storage layer has a lower bandgap than the second data storage layer.

2. The memory cell of claim 1, wherein the first data storage layer comprises a different material than the second and third data storage layers.

3. The memory cell of claim 1, wherein a conductive path is formable and dissolvable within a region of the data storage structure to couple the bottom electrode to the top electrode.

4. The memory cell of claim 1, wherein a thickness of the first data storage layer is less than a thickness of the second data storage layer, and wherein the thickness of the second data storage layer is less than a thickness of the third data storage layer.

5. The memory cell of claim 1, wherein a width of the first data storage layer discretely increases in a direction towards the bottom electrode.

6. The memory cell of claim 1, wherein the first data storage layer comprises metal atoms and oxygen atoms, wherein a bond between the metal atoms and oxygen atoms is greater than 600 kilojoules per mole.

7. The memory cell of claim 1, further comprising:
   a sidewall spacer structure laterally surrounding sidewalls of the top electrode and the data storage structure, wherein a bottom surface of the sidewall spacer structure directly contacts an upper surface of the first data storage layer.

8. The memory cell of claim 1, wherein a minimum width of the bottom electrode is greater than a maximum width of the top electrode.

9. The memory cell of claim 1, wherein the first data storage layer comprises a first pair of opposing sidewalls and a second pair of opposing sidewalls, wherein the first pair of opposing sidewalls are spaced laterally between the second pair of opposing sidewalls.

10. A memory device comprising:
    a bottom electrode;
    a top electrode overlying the bottom electrode; and
    a data storage structure disposed between the bottom electrode and the top electrode, wherein the data storage structure comprises:
      a first data storage layer contacting the bottom electrode and comprising a first material;
      a second data storage layer contacting the first data storage layer and comprising a second material different from the first material;
      a third data storage layer disposed between the second data storage layer and the top electrode, wherein the third data storage layer comprises a third material different from the first material and the second material, wherein the first, second, and third materials respectively comprise a metal oxide; and wherein respective bandgaps of the first, second, and third data storage layers gradually decrease or increase from the top electrode to the bottom electrode, wherein the top electrode is configured to receive a programming voltage and the bottom electrode is configured to receive a reference voltage.

11. The memory device of claim 10, wherein outer sidewalls of the third data storage layer are aligned with outer sidewalls of the top electrode.

12. The memory device of claim 10, wherein sidewalls of the third data storage layer are aligned with sidewalls of the bottom electrode.

13. The memory device of claim 10, wherein a first bandgap of the first data storage layer is less than 4.5 eV.

14. The memory device of claim 10, further comprising:
a capping layer overlying the top electrode;
a top electrode via overlying the capping layer; and
a sidewall spacer structure continuously extending from sidewalls of the data storage structure to a sidewall of the top electrode via, wherein the sidewall spacer structure contacts an upper surface of the capping layer.

15. The memory device of claim 10, wherein the first data storage layer comprises a pair of vertical opposing sidewalls and a pair of slanted opposing sidewalls, wherein the pair of vertical opposing sidewalls overlie the pair of slanted opposing sidewalls.

16. The memory device of claim 10, wherein a maximum width of the first data storage layer is greater than a maximum width of the third data storage layer.

17. A memory device comprising:
a substrate; and
a resistive random access memory (RRAM) cell overlying the substrate, wherein the RRAM cell comprises a top electrode, a bottom electrode, and a data storage structure disposed between the top electrode and the bottom electrode, wherein a bandgap of the data storage structure discretely decreases at least two times from a top surface of the data storage structure in a direction towards the substrate.

18. The memory device of claim 17, wherein the data storage structure comprises a top data storage layer, a bottom data storage layer, and a middle data storage layer disposed between the top data storage layer and the bottom data storage layer.

19. The memory device of claim 18, wherein a thickness of the top data storage layer is greater than a thickness of the middle data storage layer, and wherein the thickness of the middle data storage layer is greater than a thickness of the bottom data storage layer.

20. The memory device of claim 18, wherein the top data storage layer, the bottom data storage layer, and the middle data storage layer respectively comprises different high-k dielectric materials from one another.

\* \* \* \* \*